US008031250B2

(12) United States Patent
Yamashita (10) Patent No.: US 8,031,250 B2
(45) Date of Patent: Oct. 4, 2011

(54) SOLID-STATE IMAGING DEVICE AND METHOD OF DRIVING THE SAME

(75) Inventor: Hirofumi Yamashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 851 days.

(21) Appl. No.: 12/027,519

(22) Filed: Feb. 7, 2008

(65) Prior Publication Data

US 2008/0192135 A1    Aug. 14, 2008

(30) Foreign Application Priority Data

Feb. 8, 2007    (JP) .................................. 2007-029397

(51) Int. Cl.
*H04N 3/14* (2006.01)
*H04N 5/335* (2011.01)

(52) U.S. Cl. .......................... 348/308; 348/294; 348/300

(58) Field of Classification Search ........... 348/302–309
See application file for complete search history.

(56) References Cited

U.S. PATENT DOCUMENTS

| | | | |
|---|---|---|---|
| 6,486,498 B2 | 11/2002 | Yamashita | |
| 6,522,357 B2 | 2/2003 | Beiley et al. | |
| 7,209,171 B2 | 4/2007 | Suzuki et al. | |
| 7,378,635 B2 * | 5/2008 | Agranov et al. | 250/208.1 |
| 7,545,426 B2 * | 6/2009 | Hiyama et al. | 348/308 |
| 7,612,819 B2 * | 11/2009 | Nam | 348/308 |
| 7,829,832 B2 * | 11/2010 | Mauritzson et al. | 250/208.1 |
| 7,944,491 B2 * | 5/2011 | Ueno et al. | 348/308 |
| 2002/0109160 A1 * | 8/2002 | Mabuchi et al. | 257/233 |
| 2006/0050161 A1 * | 3/2006 | Inagaki et al. | 348/300 |
| 2006/0180741 A1 | 8/2006 | Agranov et al. | |

FOREIGN PATENT DOCUMENTS

| | | |
|---|---|---|
| CN | 1706182 A | 12/2005 |
| JP | 9-51896 | 2/1997 |
| JP | 2002-217397 | 8/2002 |
| JP | 2003-46865 | 2/2003 |
| JP | 2004-128296 | 4/2004 |
| JP | 2005-64550 | 3/2005 |

OTHER PUBLICATIONS

Japanese Office Action mailed on May 10, 2011 for JP 2005-373346 filed Dec. 26, 2005 with English translation.
Japanese Office Action application No. JP 2007-029397 mailed on May 10, 2011 (English Translation).

* cited by examiner

*Primary Examiner* — Jason Chan
*Assistant Examiner* — Pritham Prabhakher
(74) *Attorney, Agent, or Firm* — Oblon, Spivak, McClelland, Maier & Neustadt, L.L.P.

(57) ABSTRACT

A solid-state imaging device includes a pixel array section which includes a plurality of pixels arranged in a two-dimensional manner, and a vertical scanning circuit which successively performs selection and scanning for a plurality of rows of the pixel array section. Each of the pixels includes a photoelectric conversion element, a transfer transistor which transfers a signal charge of the photoelectric conversion element to a detecting section, a reset transistor which sets a voltage of the detecting section to a voltage of a power supply terminal, and an amplifying transistor which amplifies and reads a signal charge of the detecting section. A first voltage which is lower than a power supply voltage is applied to the detecting section, in a charge-storage period of the photoelectric conversion element.

15 Claims, 4 Drawing Sheets

SOLID-STATE IMAGING DEVICE AND METHOD OF DRIVING THE SAME

CROSS-REFERENCE TO RELATED APPLICATIONS

This application is based upon and claims the benefit of priority from prior Japanese Patent Application No. 2007-029397, filed Feb. 8, 2007, the entire contents of which are incorporated herein by reference.

BACKGROUND OF THE INVENTION

1. Field of the Invention

The present invention relates to a solid-state imaging device and a method of driving the same, for example, an MOS solid-state imaging device used for complementary metal oxide semiconductor (CMOS) sensor cameras ready for low-voltage drive and moving images and a method of driving the same.

2. Description of the Related Art

In recent years, MOS solid-state imaging devices using a CMOS sensor have become commercially practical. MOS solid-state imaging devices amplify a signal, which is detected by a photodiode, by a MOS transistor for each cell, and feature high sensitivity.

Each cell (pixel) of the solid-state imaging devices is formed of a photodiode for photoelectric conversion, a read transistor for signal reading, an amplifying transistor for signal amplification, and a reset transistor to reset a signal charge, etc. A source of the amplifying transistor is connected to a vertical signal line, and a signal output to the vertical signal line is output to a horizontal signal line through a horizontal selection transistor.

The pixel size of the solid-state imaging devices has been reduced year after year, due to increase in the number of pixels and demand for reduction in the optical size. For example, the pixel size of CMOS sensors used for digital cameras and the like in recent years is about 2 to 3 µm. Since the number of photons which can receive light is reduced in such fine pixels, the signal-to-noise ratio cannot be maintained unless noise is reduced to compensate it. When the signal-to-noise ratio cannot be maintained, the image quality in playback images degrades, and the quality of playback images degrades. Dark current noise which flows into photodiodes during charge storage is one of the main forms of noise. Reducing dark current noise is indispensable for maintaining the signal-to-noise ratio in fine pixels.

In the meantime, in operation of reading a signal from a photodiode, it is necessary to read all charges to prevent leaving of any charges in the photodiode, to suppress an afterimage phenomenon which is caused by reading charges, which were stored in the previous frame, in the following frame. Therefore, it is impossible to increase the threshold of the transfer transistor. The dopant concentration of the channel dope layer of the transfer transistor is low, and generally about $1.0 \times 10^{15}$ $cm^{-2}$ to $1.0 \times 10^{17}$ $cm^{-2}$.

When the channel dope layer has such a dopant concentration, the semiconductor substrate interface directly under the transfer transistor becomes depleted during a charge storage period of the photodiode (during the read transistor turning off). Therefore, electrons being minor carriers are generated to form a dark current, and the dark current flows into the photodiode. The value of the flowing dark current varies pixel to pixel, and thus the dark current becomes a fixed pattern noise on the playback image, and the signal-to-noise ratio in the playback image degrades.

To deal with the above problem, a patent document (Jpn. Pat. Appln. KOKAI Pub. No. 2002-217397) takes the following measure. Specifically, a negative voltage is applied to the gate of the transfer transistor during a charge-storage period, and thereby a sufficient number of positive holes being major carriers are stored in the channel dope layer of the transfer transistor. Thereby, the speed of generating electrons in the interface of the semiconductor substrate remarkably decreases. Thus, the dark current flowing into the photodiode is reduced, and thereby the fixed pattern noise is reduced.

However, the patent document has the following problem. Specifically, when a negative voltage of, for example, −2 V is applied to the gate of the transfer transistor during a charge-storage period, a difference in potential of about 5.5 V occurs between a floating diffusion layer (detecting section) which is biased to, for example, 2.5 V during the charge-storage period and the gate of the transfer transistor. Most of the difference in potential is applied to an end portion on the detection section side in the gate insulating film of the transfer transistor. However, when the electric field applied to the gate insulating film exceeds $5 \times 10^6$ V/cm, generally the voltage-withstand reliability of the gate insulating film degrades, and the insulating property of the gate insulating film badly decreases during operation of the device. Thereby, the gate of the transfer transistor and the floating diffusion layer are short-circuited, and it is impossible to perform signal reading operation of pixels.

Since the thickness of the gate insulating film is about 50 Å in the general CMOS device manufacturing process in recent years, when the above difference in potential is applied to the gate insulating film, the electric field applied to the gate insulating film is about $9 \times 10^6$ V/cm at the maximum. Therefore, according to the device driving method of the above patent document, the reliability of the gate insulating film may degrade, and the device operation may become impossible.

BRIEF SUMMARY OF THE INVENTION

According to an aspect of the present invention, there is provided a solid-state imaging device comprising: a pixel array section which includes a plurality of pixels arranged in a two-dimensional manner; and a vertical scanning circuit which successively performs selection and scanning for a plurality of rows of the pixel array section. Each of the pixels includes a photoelectric conversion element, a transfer transistor which transfers a signal charge of the photoelectric conversion element to a detecting section, a reset transistor which sets a voltage of the detecting section to a voltage of a power supply terminal, and an amplifying transistor which amplifies and reads a signal charge of the detecting section. A first voltage which is lower than a power supply voltage is applied to the detecting section, in a charge-storage period of the photoelectric conversion element.

According to an aspect of the present invention, there is provided a method of driving a solid-state imaging device having a pixel array section which includes a plurality of pixels arranged in a two-dimensional manner, each of the pixels including a photoelectric conversion element, a transfer transistor which transfers a signal charge of the photoelectric conversion element to a detecting section, a reset transistor which sets a voltage of the detecting section to a voltage of a power supply terminal, and an amplifying transistor which amplifies and reads a signal charge of the detecting section, the method comprising: applying a first voltage which is lower than a power supply voltage to the detecting section, in a charge-storage period of the photoelectric conversion element.

DETAILED DESCRIPTION OF THE INVENTION

Embodiments of the present invention are described below with reference to drawings. Constituent elements having the same functions and structures are denoted by the same respective reference numerals in the following explanation, and explanation thereof is repeated only when necessary.

First Embodiment

Figure 1:
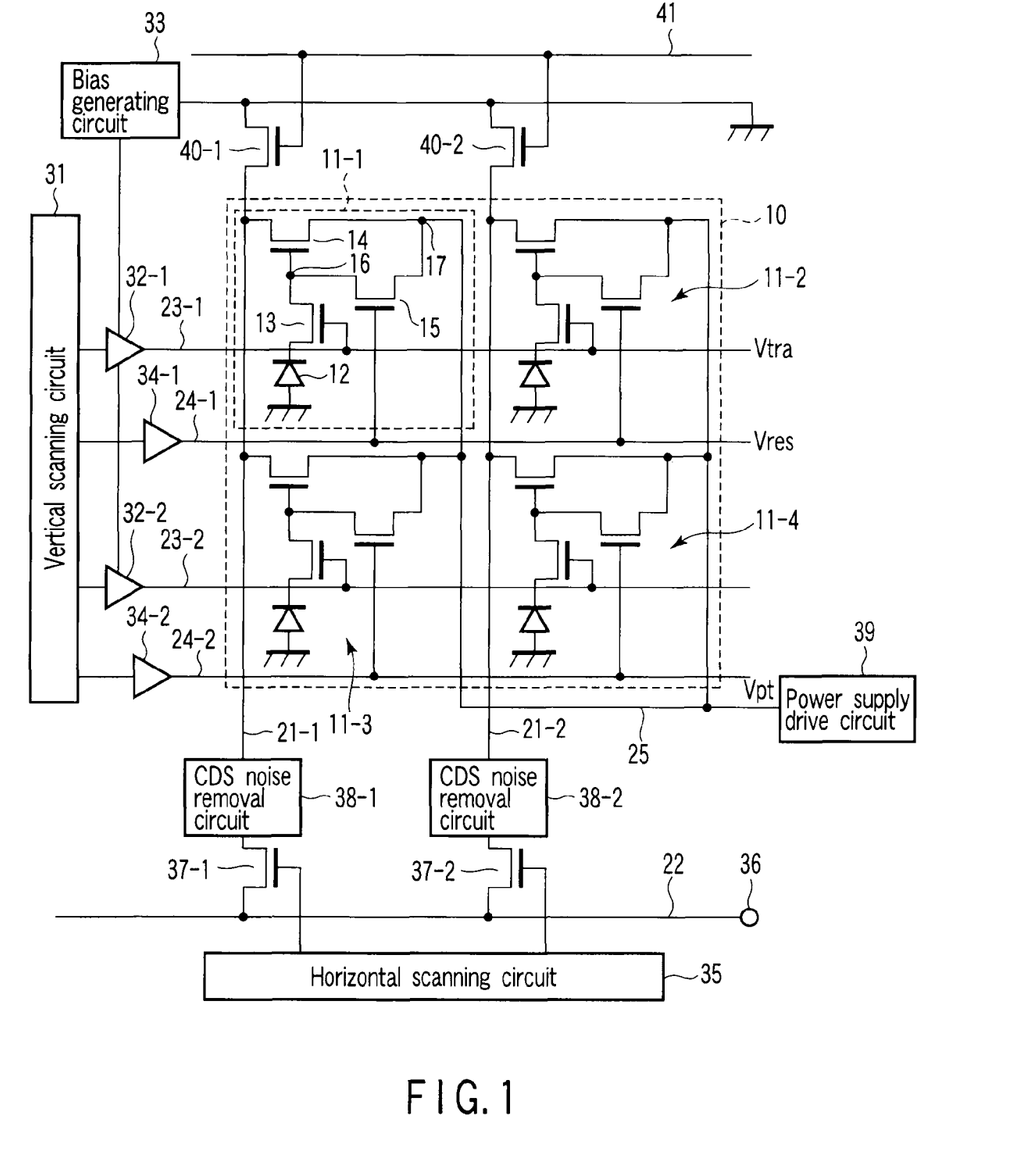
FIG. 1 is a circuit block diagram illustrating a solid-state imaging device according to a first embodiment of the present invention.

FIG. 1 is a circuit block diagram illustrating a solid-state imaging device according to a first embodiment of the present invention. The solid-state imaging device comprises a pixel array section 10 in which a plurality of pixels (picture elements) 11 are arranged in a two-dimensional manner, and peripheral circuits such as a register which scans the pixel array section 10. Although FIG. 1 illustrates pixels of 2 columns and 2 rows (pixels 11-1 to 11-4) as an example, actually more pixels are arranged.

The pixel array section 10 is provided with a vertical signal line 21 for each pixel column. Further, the pixel array section 10 is provided with a charge transfer line 23, a reset line 24, and a drive line 25 for each pixel row.

Each pixel 11 is formed of a photoelectric conversion element (for example, a photodiode) 12, a transfer transistor 13, an amplifying transistor 14, a reset transistor 15, a floating diffusion layer (detecting section) 16, and a power supply terminal 17. N-channel MOS transistors are used as the transistors 13 to 15, for example.

The photodiode 12 performs photoelectric conversion to convert incident light into a signal charge (for example, electrons) of a charge amount corresponding to the light amount of the incident light, and stores the signal charge. An anode of the photodiode 12 is grounded. The transfer transistor is connected between a cathode of the photodiode 12 and the floating diffusion layer 16. A gate of the transfer transistor 13 is connected to the charge transfer line 23. The transfer transistor 13 is turned on and turned off by the voltage of the charge transfer line 23, and transfers the signal charge stored in the photodiode 12 to the floating diffusion layer 16.

A drain of the reset transistor 15 is connected to the power supply terminal 17, a source of the reset transistor 15 is connected to the floating diffusion layer 16, and a gate of the reset transistor 15 is connected to the reset line 24. The reset transistor 15 is turned on and off by the voltage of the reset line 24, and sets, in the on state, the voltage of the floating diffusion layer 16 to the voltage of the power supply terminal 17.

A drain of the amplifying transistor 14 is connected to the power supply terminal 17, a source of the amplifying transistor 14 is connected to the vertical signal line 21, and a gate of the amplifying transistor 14 is connected to the floating diffusion layer 16. The amplifying transistor 14 outputs the voltage of the floating diffusion layer 16, which has been reset by the reset transistor 15, as a reset level. Further, the amplifying transistor 14 outputs the voltage of the floating diffusion layer 16 after the signal charge is transmitted from the photodiode 12 through the transfer transistor 13, as a signal level.

The solid-state imaging device has a vertical scanning circuit 31, a bias generating circuit 33, a horizontal scanning circuit 35, a correlated double-sampling (CDS) noise removal circuit 38, and a power supply drive circuit 39.

The vertical scanning circuit 31 is connected to the charge transfer lines 23-1 and 23-2 through buffers 32-1 and 32-2, respectively. Further, the vertical scanning circuit 31 is connected to the reset lines 24-1 and 24-2 through buffers 34-1 and 34-2, respectively. The vertical scanning circuit 31 is formed of a shift register or a decoder, and successively outputs vertical scanning pulses to successively select and drive pixels 11 of the pixel array section 10 row by row.

The buffers 32 are connected to the bias generating circuit 33. The bias generating circuit 33 generates a voltage used for setting the voltages of the charge transfer lines 23. Specifically, the bias generating circuit 33 generates a high-level voltage to turn on the transfer transistors 13, and a negative voltage to turn off the transfer transistors 13. The buffers 32 set the voltages of the charge transfer lines 23 by using these voltages.

The power supply drive circuit 39 is connected to the power supply terminal 17 of each pixel 11. The power supply drive circuit 39 applies, to the power supply terminal 17 of the pixel 11, various voltages according to the operation timing. The operation of the power supply drive circuit 39 will be described later.

One ends of the vertical signal lines 21-1 and 21-2 are connected with load transistors 40-1 and 40-2, respectively, each of which is formed of an N-channel MOS transistor. Specifically, a drain of each load transistor 40 is connected to the vertical signal line 21, and a source of each load transistor 40 is grounded. A gate of each load transistor 40 is connected to a load line 41 and serves as a constant-current source.

The other ends of the vertical signal lines 21-1 and 21-2 are connected with CDS noise removal circuits 38-1 and 38-2, respectively. Each CDS noise removal circuit 38 samples and holds the voltage of the vertical signal line 21, and performs correlated double sampling. Correlated double sampling is processing of sampling two voltage signals input in chronological order, and outputting the difference between the voltage signals.

The CDS noise removal circuits 38-1 and 38-2 are connected to the horizontal signal line 22 through horizontal selection transistors 37-1 and 37-2, respectively, each of which is formed of an N-channel MOS transistor. A gate of each horizontal selection transistor 37 is connected with the horizontal scanning circuit 35. The horizontal scanning circuit 35 is formed of a shift register or a decoder, and successively outputs horizontal scanning pulses to successively select and scan the horizontal selection transistors 37. The horizontal selection transistors 37 successively become the on state in response to the horizontal scanning pulses, and thereby pixel signals which have been subjected to signal processing by the CDS noise removal circuits 38 are successively output to the horizontal signal line 22, and output to the outside through an output terminal 36.

Figure 2:
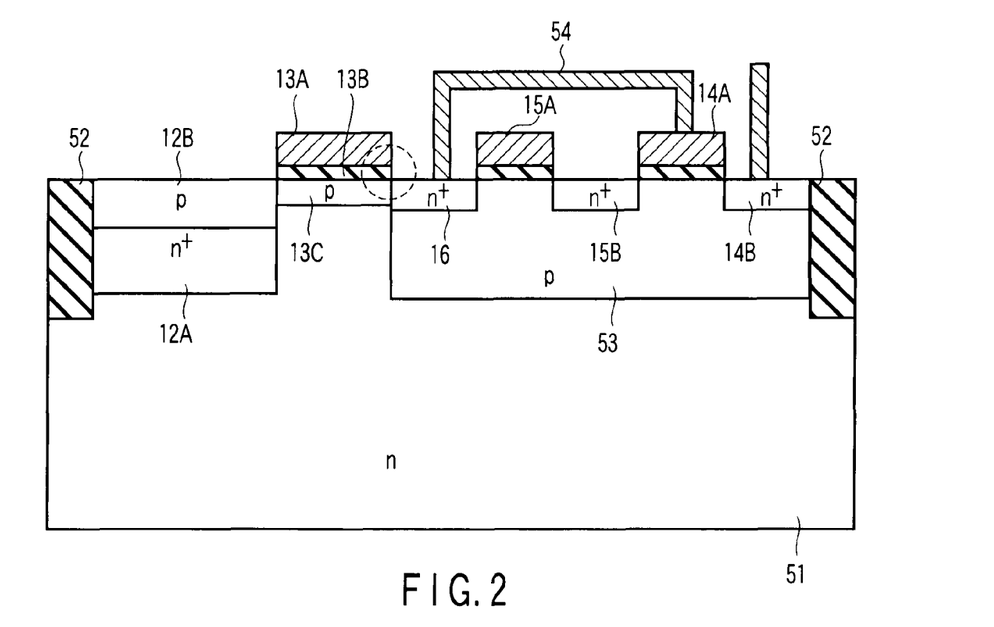
FIG. 2 is a cross-sectional view illustrating a structure of a pixel 11 illustrated in FIG. 1.

FIG. 2 is a cross-sectional view illustrating a structure of each pixel 11 showed in FIG. 1. An element isolation insulating layer 52 is formed on a surface region of an n-type semiconductor substrate 51, to electrically insulate a plurality of pixels 11 from one another. The element isolation insulating layer 52 is formed of, for example, shallow trench isolation (STI). For example, silicon is used as the semiconductor substrate 51, and silicon oxide is used as the STI 52.

A charge storing region 12A forming the photodiode 12 is formed in the n-type semiconductor substrate 51. The charge storing region 12A is formed of an $n^+$ type diffusion layer, which is formed by doping $n^+$ type impurity of high concentration into the semiconductor substrate 51. A surface shield layer 12B formed of a p-type diffusion layer is formed on the charge storing region 12A.

Further, a p-type well 53 is formed in the semiconductor substrate 51. The amplifying transistor 14 and the reset transistor 15 are formed in the p-type well 53. In the p-type well 53, $n^+$ type diffusion layers (the floating diffusion layer 16, an $n^+$ type diffusion layer 15B, and an $n^+$ type diffusion layer 14B) are formed. The $n^+$ type diffusion layers are formed by doping $n^+$ type impurity of high concentration, and function as a source/drain of the transistors. The $n^+$ type diffusion layer 15B is connected to the power supply terminal 17. The $n^+$ type diffusion layer 14B is connected to the vertical signal line 21.

A gate electrode 15A of the reset transistor 15 is formed between the floating diffusion layer 16 and the $n^+$ type diffusion layer 15B and on the semiconductor substrate 51, with a gate insulating film interposed therebetween. A gate electrode 14A of the amplifying transistor 14 is formed between the $n^+$ type diffusion layer 14B and the $n^+$ type diffusion layer 15B and on the semiconductor substrate 51, with a gate insulating film interposed therebetween. The gate electrode 14A and the floating diffusion layer 16 are connected to each other by a wiring layer 54.

A channel dope region 13C of the transfer transistor 13 formed of a p-type diffusion layer is formed between the charge storing region 12A and the floating diffusion layer 16 and in the semiconductor substrate 51. A gate electrode 13A of the transfer transistor 13 is formed n the channel dope region 13C, with a gate insulating film 13 interposed therebetween. One pixel 11 is structured as described above.

Figure 3:
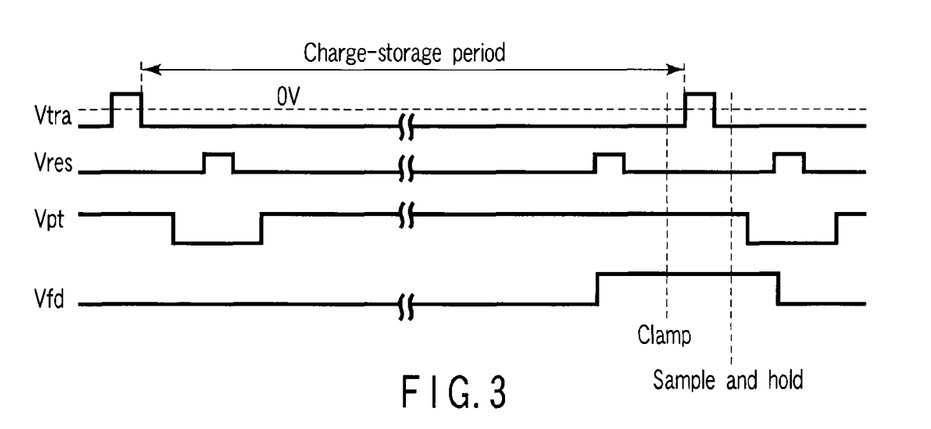
FIG. 3 is a timing chart illustrating operation of the solid-state imaging device according to the first embodiment.

Next, operation of the solid-state imaging device is explained. FIG. 3 is a timing chart illustrating operation of the solid-state imaging device. As an example, explained is an operation of driving one pixel (for example, pixel 11-1) of the solid-state imaging device. In FIG. 3, Vtra denotes a gate voltage of the transfer transistor 13 (voltage of the charge transfer line 23), Vres denotes a gate voltage of the reset transistor 15 (voltage of the reset line 24), Vpt denotes a voltage of the power supply terminal 17 (voltage generated by the power supply drive circuit 39), and Vfd denotes a voltage of the floating diffusion layer 16 (detecting section).

Further, the charge-storage period illustrated in FIG. 3 is a period during which the photodiode 12 stores charge. Specifically, it is a period from the time when a drive pulse is once supplied to the transfer transistor 13 (when the transfer transistor 13 is turned off) to the time when a drive pulse is supplied again (when the transfer transistor 13 is turned on).

The power supply drive circuit 39 generates high-level voltage, for example, 2.8 V, and applies the high-level voltage to the power supply terminal 17 of the pixel 11. First, the vertical scanning circuit 31 and the bias generating circuit 33 set the gate voltage Vtra of the transfer transistor 13 from the high level to a negative voltage (about −2 V), and thereby turn off the transfer transistor 13. From this point in time, charge storage is started in the photodiode 12.

Next, the power supply drive circuit 39 reduces the voltage Vpt to low level (about 0.5 V), in the early stage (beginning) of the charge-storage period of the photodiode 12 (for example, directly after the charge-storage period is started). Then, in the early stage of the charge-storage period, the vertical scanning circuit 31 applies a high-level gate voltage Vres to the reset transistor 15, and turns on the reset transistor 15. Thereby, the power supply terminal 17 and the voltage of the floating diffusion layer 16 are set to 0.5 V.

Next, the vertical scanning circuit 31 applies a low-level gate voltage Vres to the reset transistor 15, and turns off the reset transistor 15. Thereafter, the power supply drive circuit 39 increases the voltage Vpt to 2.8 V. After this operation, the voltage Vfd of the floating diffusion layer 16 becomes about 0.3 V to 0.5 V.

Further, when the voltage Vfd of the floating diffusion layer 16 is about 0.5 V, a pass-through current flowing through a source-follower circuit formed of the load transistor 40 and the amplifying transistor 14 is sufficiently small, and the source-follower circuit is inactivated. Therefore, the column comes into a non-selected state.

Further, the vertical scanning circuit 31 and the bias generating circuit 33 set the gate voltage Vtra of the transfer transistor 13 to about −2 V during the charge-storage period, to reduce a dark current occurring in the interface of the semiconductor substrate 51 directly under the transfer transistor 13. If the gate voltage of the transfer transistor 13 is set to a negative voltage during the charge-storage period, the interface between Si and $SiO_2$ directly under the transfer transistor 13 is negatively biased. Therefore, holes, which have stored in the p-type diffusion layer in the semiconductor (Si) substrate, flow to the interface between Si and $SiO_2$ directly under the transfer transistor 13 and store therein. As a result, the interface between Si and $SiO_2$ directly under the transfer transistor 13 cannot become depleted. Accordingly, since the dark current that occurs in the interface between Si and $SiO_2$ directly under the transfer transistor 13 is reduced, the fixed pattern noise on the playback image is also reduced, thereby improving the signal-to-noise ratio. Thereby, during the charge-storage period, a difference in potential of about 2.5 V occurs in a part of the gate insulating film 13B between the gate electrode 13A of the transfer transistor 13 and the floating diffusion layer 16 (an encircled part in FIG. 2). The electric field applied to the gate insulating film 13B during the time is $5 \times 10^6$ V/cm at the maximum. Therefore, it is possible to prevent degradation in the reliability of the gate insulating film 13B of the transfer transistor 13.

Next, at the last stage (end) of the charge-storage period (for example, directly before the charge-storage period is ended), the vertical scanning circuit 31 applies high-level gate voltage Vres to the reset transistor 15, and turns on the rest transistor 15. Thereby, the voltage Vfd of the floating diffusion layer 16 is set to the voltage Vpt (2.8 V) of the power supply terminal 17. Thereafter, the vertical scanning circuit 31 applies low-level gate voltage Vres to the reset transistor 15, and turns off the reset transistor 15. During the operation, the voltage Vfd of the floating diffusion layer 16 is about 2.5 V.

During the operation, a sufficiently high voltage is applied to the floating diffusion layer 16, and thus the pass-through current flowing through the source-follower circuit formed of the load transistor 40 and the amplifying transistor 14 becomes sufficiently large, and the source-follower circuit is activated. Although a high electric field is temporarily applied to the gate insulating film 13B between the transfer transistor 13 and the floating diffusion layer 16, the period for which the high electric field is applied is sufficiently short, and thus the reliability of the gate insulating film 13B does not degrade.

After the reset transistor 15 is turned off, the voltage of the floating diffusion layer 16 is read by the source-follower circuit as an output signal (dark level) to the vertical signal line 21. The dark level is taken and clamped by the CDS noise removal circuit 38.

Then, the vertical scanning circuit 31 and the bias generating circuit 33 set the gate voltage Vtra of the transfer transistor 13 to high-level voltage (about 2.8 V), and turn on the transfer transistor 13. Thereby, the signal charge stored in the photodiode 12 is transferred to the floating diffusion layer 16.

Next, the voltage of the floating diffusion layer 16 modulated by the signal charge is read by the source-follower circuit as the output signal (signal level) to the vertical signal line 21, and the signal level is supplied to the CDS noise removal circuit 38. The CDS noise removal circuit 38 samples and holds the difference between the signal level and the clamped dark level. Thereafter, the signal held by the CDS noise removal circuit 38 is output from the output terminal 36.

As detailed above, according to the first embodiment, a negative voltage is applied to the gate of the transfer transistor 13 during at least a certain period of the charge-storage period, and thereby it is possible to reduce dark current occurring in the interface of the semiconductor substrate 51 directly under the transfer transistor 13. Further, a sufficiently low voltage is applied to the floating diffusion layer 16 during at least a certain period in the period for which a negative voltage is applied to the gate of the transfer transistor 13, to prevent application of a high electric field to a part of the gate insulating film 13B (the encircled part in FIG. 2) between the gate electrode 13A of the transfer transistor 13 and the floating diffusion layer 16. This prevents reduction in the reliability of the gate insulating film 13B, and thus it is possible to obtain a sufficient signal-to-noise ratio in playback images.

Second Embodiment

According to a second embodiment, the voltage applied from the power supply drive circuit 39 to the power supply terminals 17 of the pixels 11 is set to a plurality of levels of at least three values.

Varying the power supply voltage level applied to the power supply terminal 17 according to, for example, the illumination of the subject is effective for increasing the signal-to-noise ratio of the playback image. For example, when the scene in which the subject has low illumination is imaged by the solid-state imaging device, the signal charge amount taken for each pixel is reduced. Therefore, to obtain a clear playback image, it is necessary to sufficiently increase the signal-to-noise ratio, and sufficiently decrease the noise level.

When a negative voltage is applied to the gate of the transfer transistor 13 during the charge-storage period, the difference in potential of the floating diffusion layer 16 from the gate electrode 13A of the transfer transistor 13 increases in the positive direction. Therefore, the electric field applied to a PN junction part between the channel dope region 13C of the transfer transistor 13 and the floating diffusion layer 16 increases, and noise electrons forming an interband tunneling current flow from the semiconductor substrate 51 into the floating diffusion layer 16.

To reduce the noise electrons, it is necessary to sufficiently reduce the difference in potential between the gate of the transfer transistor 13 and the floating diffusion layer 16.

Therefore, when the illumination of the subject is low and it is necessary to sufficiently reduce the noise level, the voltage applied from the power supply drive circuit 39 to the power supply terminal 17 of each pixel 11 is set to a low value to reduce the number of noise electrons.

On the other hand, when the illumination of the subject is high and it is unnecessary to reduce the noise level, the voltage applied from the power supply drive circuit 39 to the power supply terminal 17 of each pixel 11 is increased to high level (about 2.8 V), as explained in the first embodiment. Thereby, the voltage of the floating diffusion layer 16 after the reset transistor 15 is turned on directly before signal reading becomes sufficiently high, and the number of electrons which can be stored in the floating diffusion layer 16 is sufficiently increased. Therefore, it is possible to increase the dynamic range of the pixels 11.

Figure 4:
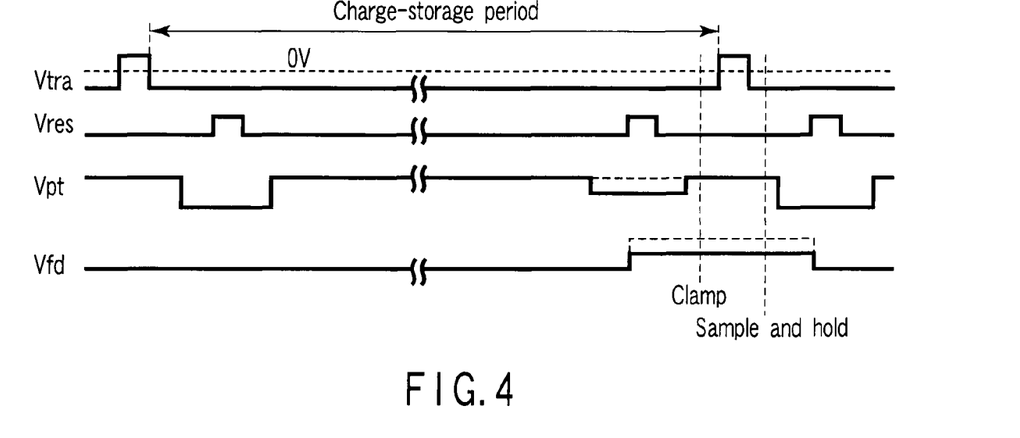
FIG. 4 is a timing chart illustrating operation of a solid-state imaging device according to a second embodiment of the present invention.

FIG. 4 is a timing chart illustrating operation of a solid-state imaging device according to the second embodiment of the present invention. In the second embodiment, explained is the case in which voltage of three levels is applied to the power supply terminal 17 of each pixel 11. The structure of the solid-state imaging device is the same as that of FIG. 1.

The power supply drive circuit 39 sets the voltage Vpt to an intermediate level between a high-level voltage (about 2.8 V) and a low level voltage (about 0.5 V), at the last stage (end) of the charge-storage period (for example, directly before the charge-storage period is ended). Next, the vertical scanning circuit 31 applies a high-level gate voltage Vres to the reset transistor 15, and turns on the reset transistor 15. Thereby, the voltage Vfd of the floating diffusion layer 16 is set to the voltage Vpt (intermediate level) of the power supply terminal 17. Thereafter, the vertical scanning circuit 31 applies a low-level gate voltage Vres to the reset transistor 15, and turns off the reset transistor 15.

During the operation, since the intermediate-level voltage is applied to the floating diffusion layer 16, a pass-through current flowing through a source-follower circuit formed of the load transistor 40 and the amplifying transistor 14 is increased, and the source-follower circuit is activated. The difference in voltage between the gate of the transfer transistor 13 and the floating diffusion layer 16 is reduced in comparison with the first embodiment. Thereby, it is possible to reduce the number of noise electrons flowing from the semiconductor substrate 51 into the floating diffusion layer 16. Further, since the difference in voltage between the gate of the transfer transistor 13 and the floating diffusion layer 16 is reduced, the electric field applied to the gate insulating film 13B of the transfer transistor 13 is also reduced. This prevents degradation in the reliability of the gate insulating film 13B of the transfer transistor 13.

After the reset transistor 15 is turned off, the intermediate-level voltage of the floating diffusion layer 16 is read by the source-follower circuit as an output signal (dark level) to the vertical signal line 21. The dark level is taken and clamped by the CDS noise removal circuit 38.

Next, the vertical scanning circuit 31 sets the gate voltage Vtra of the transfer transistor 13 to the high-level voltage (about 2.8 V), and turns on the transfer transistor 13. Thereby, the signal charge stored in the photodiode 12 is transferred to the floating diffusion layer 16.

As detailed above, according to the second embodiment, when the illumination of the subject is low and it is necessary to sufficiently reduce the noise level, the voltage applied from the power supply drive circuit 39 to the power supply terminal 17 of each pixel 11 is reduced to an intermediate level between the high level and the low level. Thereby, it is possible to reduce the number of noise electrons flowing into the floating diffusion layer 16. Therefore, it is possible to obtain a clear playback image, even when the signal charge amount taken for each pixel is small. The other effects are the same as those of the first embodiment.

Third Embodiment

Figure 5:
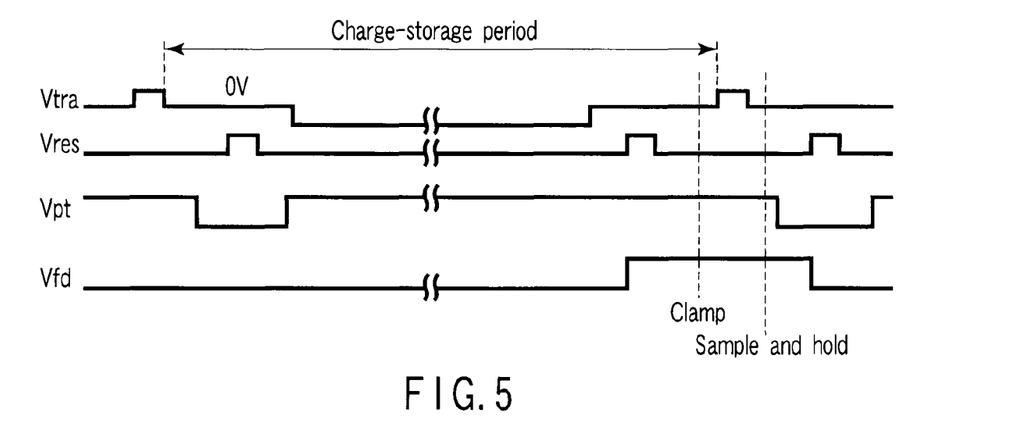
FIG. 5 is a timing chart illustrating operation of a solid-state imaging device according to a third embodiment of the present invention.

According to a third embodiment, the period for which a negative voltage is applied to the gate of the transfer transistor 13 is further shortened in comparison with the first embodiment, and thereby degradation in the reliability of the gate insulating film 13B is further prevented.

FIG. 5 is a timing chart illustrating operation of a solid-state imaging device according to the third embodiment of the present invention. The structure of the solid-state imaging device is the same as FIG. 1.

The power supply drive circuit 39 generates a high-level voltage, for example, 2.8 V, and applies the high-level voltage to the power supply terminal 17 of each pixel 11. First, the vertical scanning circuit 31 and the bias generating circuit 33 change the gate voltage Vtra of the transfer transistor 13 from high level to a ground voltage (0 V), and turn off the transfer transistor 13. From this point in time, charge storage is started in the photodiode 12.

Next, the power supply drive circuit 39 reduces the voltage Vpt to low level (about 0.5 V), at the early stage (beginning) of the charge-storage period of the photodiode 12 (for example, directly after the charge-storage period is started). Thereafter, at the early stage of the charge-storage period, the vertical scanning circuit 31 applies a high-level gate voltage Vres to the reset transistor 15, and turns on the reset transistor 15. Thereby, the power supply terminal 17 and the voltage Vfd of the floating diffusion layer 16 are set to 0.5 V.

Next, the vertical scanning circuit 31 applies a low-level gate voltage Vres to the reset transistor 15, and turns off the reset transistor 15. Thereafter, the power supply drive circuit 39 increases the voltage Vpt to 2.8 V. After this operation, the voltage Vfd of the floating diffusion layer 16 becomes about 0.3 V to 0.5 V.

Then, the vertical scanning circuit 31 and the bias generating circuit 33 set the gate voltage Vtra of the transfer transistor 13 to about −2 V, to reduce a dark current occurring in the interface of the semiconductor substrate 51 directly under the transfer transistor 13. Thereby, during the charge-storage period, a difference in potential of about 2.5 V occurs in a part of the gate insulating film 13B between the gate electrode 13A of the transfer transistor 13 and the floating diffusion layer 16 (an encircled part in FIG. 2). The electric field applied to the gate insulating film 13B during the time is $5 \times 10^6$ V/cm at maximum.

Next, at the last stage (end) of the charge-storage period (for example, directly before the charge-storage period is ended), the vertical scanning circuit 31 and the bias generating circuit 33 set the gate voltage Vtra of the transfer transistor 13 to 0 V. Then, the vertical scanning circuit 31 applies high-level gate voltage Vres to the reset transistor 15, and turns on the rest transistor 15. Thereby, the voltage Vfd of the floating diffusion layer 16 is set to the voltage Vpt (2.8 V) of the power supply terminal 17. Thereafter, the vertical scanning circuit 31 applies low-level gate voltage Vres to the reset transistor 15, and turns off the reset transistor 15. During the operation, the voltage Vfd of the floating diffusion layer 16 is about 2.5 V.

During the operation, a sufficiently high voltage is applied to the floating diffusion layer 8, and thus the pass-through current flowing through the source-follower circuit formed of the load transistor 40 and the amplifying transistor 14 becomes sufficiently large, and the source-follower circuit is activated. Since a lower electric field is applied to the gate insulating film 13B between the transfer transistor 13 and the floating diffusion layer 16 in comparison with the first embodiment, the reliability of the gate insulating film 13B does not degrade.

After the reset transistor 15 is turned off, the voltage of the floating diffusion layer 16 is read by the source-follower circuit as an output signal (dark level) to the vertical signal line 21. The dark level is taken and clamped by the CDS noise removal circuit 38.

Then, the vertical scanning circuit 31 and the bias generating circuit 33 set the gate voltage Vtra of the transfer transistor 13 to high-level voltage (about 2.8 V), and turn on the transfer transistor 13. Thereby, the signal charge stored in the photodiode 12 is transferred to the floating diffusion layer 16.

Next, the voltage of the floating diffusion layer 16 modulated by the signal charge is read by the source-follower circuit as the output signal (signal level) to the vertical signal line 21, and the signal level is supplied to the CDS noise removal circuit 38. The CDS noise removal circuit 38 samples and holds the difference between the signal level and the clamped dark level. Thereafter, the signal held by the CDS noise removal circuit 38 is output from the output terminal 36.

As detailed above, according to the third embodiment, the period for which an electric field of $5 \times 10^5$ V/cm or more is applied to the gate insulating film 13B of the transfer transistor 13 is further shortened in comparison with the first embodiment. Specifically, it is possible to prevent application of an electric field of $5 \times 10^5$ V/cm or more to the gate insulating film 13B, also in the period for which the reset transistor 15 is turned on ad the voltage Vfd of the floating diffusion layer 16 is set to about 2.5 V. Therefore, it is possible to further reduce dark current noise flowing into the photodiode 12, without degrading the reliability of the gate insulating film 13B.

Fourth Embodiment

Figure 6:
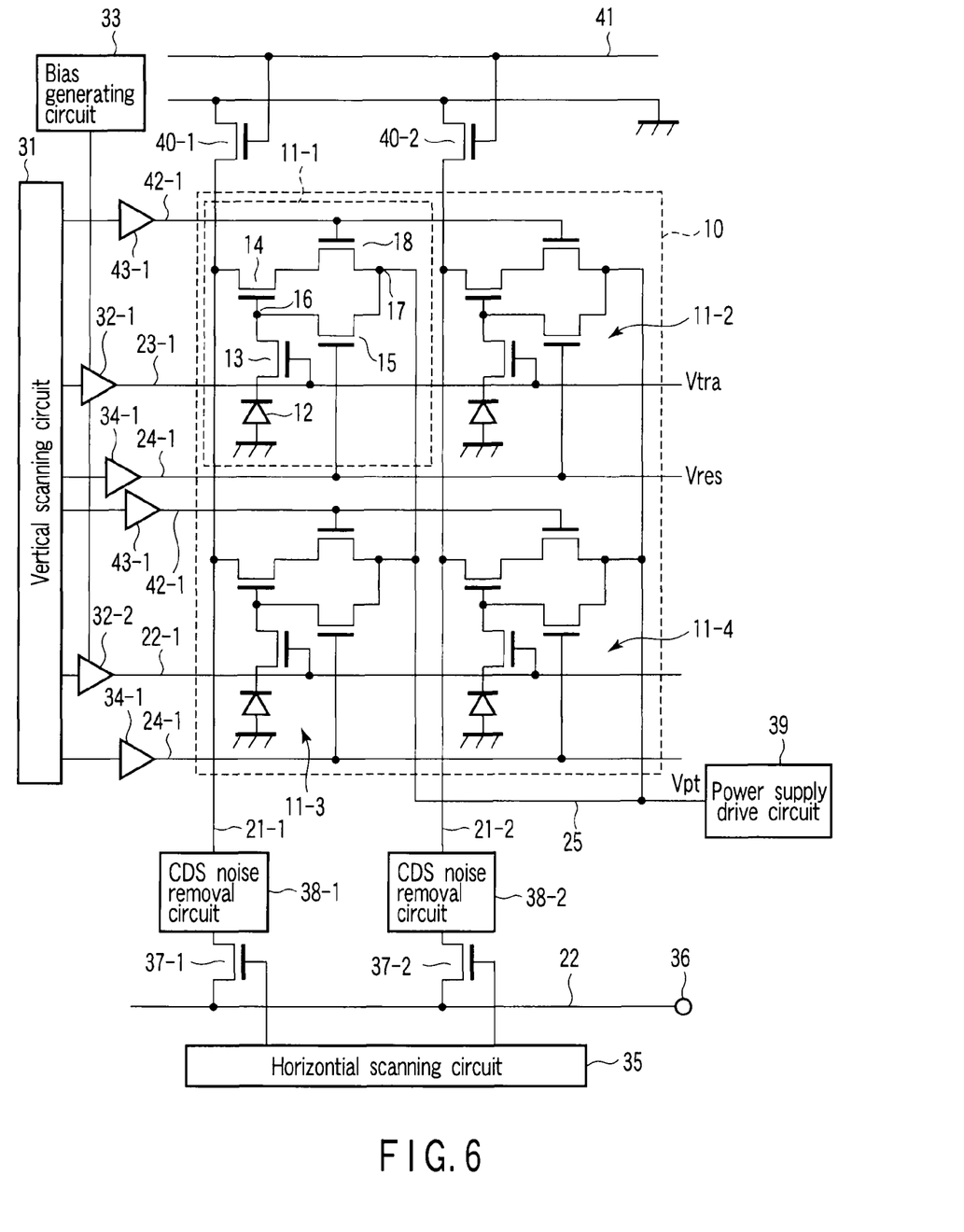
FIG. 6 is a timing chart illustrating operation of a solid-state imaging device according to a fourth embodiment of the present invention.

Fourth embodiment illustrates another example of the structure of pixel 11. FIG. 6 is a circuit block diagram illustrating a solid-state imaging device according to the fourth embodiment of the present invention.

A pixel array section 10 is provided with a vertical selection line 42 (42-1 and 42-2) for each pixel row. A vertical scanning circuit 31 is connected to the vertical selection lines 42-1 and 42-2 through buffers 43-1 and 43-2, respectively.

Each pixel 11 has a vertical selection transistor 18 which is formed of, for example, an N-channel MOS transistor. A source of the vertical selection transistor 18 is connected to a power supply terminal 17, a source of the vertical selection transistor 18 is connected to a drain of an amplifying transistor 14, and a gate of the vertical selection transistor 18 is connected to the vertical selection line 42.

The vertical scanning circuit 31 controls turning-on and turning-off of the vertical selection transistors 18, and thereby performs row selection of the pixel array section 10. Thereby, source-follower circuits, each of which is formed of a load transistor 40 and the amplifying transistor 14, are activated and inactivated.

Even when the driving methods of FIGS. 3 to 5 are applied to the solid-state imaging device having the above structure, it is possible to obtain the same effects as those explained in the first to third embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
a pixel array section which includes a plurality of pixels arranged in a two-dimensional manner; and
a vertical scanning circuit which successively performs selection and scanning for a plurality of rows of the pixel array section,
wherein each of the pixels includes a photoelectric conversion element, a transfer transistor which transfers a signal charge of the photoelectric conversion element to a detecting section, a reset transistor which sets a voltage of the detecting section to a voltage of a power supply terminal, and an amplifying transistor which amplifies and reads a signal charge of the detecting section,
the detecting section is set to a first voltage lower than a power supply voltage in a charge-storage period of the photoelectric conversion element,
a gate of the transfer transistor is set to a negative voltage in a first stage of the charge-storage period, and
the gate of the transfer transistor is set to a ground voltage in a second stage of the charge-storage period.

2. The device according to claim 1, further comprising:
a power supply drive circuit which applies the first voltage to the power supply terminal,
wherein the vertical scanning circuit applies the first voltage to the detecting section by turning on the reset transistor.

3. The device according to claim 1, further comprising:
a bias generating circuit which applies the negative voltage and the ground voltage to the gate of the transfer transistor.

4. The device according to claim 1, wherein
each of the pixels includes a selection transistor which is connected between the power supply terminal and a drain of the amplifying transistor and used for row selection of the pixel array section.

5. The device according to claim 1, further comprising:
a horizontal scanning circuit which successively performs selection and scanning for a plurality of columns of the pixel array section.

6. The device according to claim 5, further comprising:
an output terminal which outputs a signal amplified by an amplifying transistor included in a pixel selected by the horizontal scanning circuit.

7. The device according to claim 1, wherein
the detecting section is set to the power supply voltage in the second stage of the charge-storage period.

8. A method of driving a solid-state imaging device having a pixel array section which includes a plurality of pixels arranged in a two-dimensional manner,
each of the pixels including a photoelectric conversion element, a transfer transistor which transfers a signal charge of the photoelectric conversion element to a detecting section, a reset transistor which sets a voltage of the detecting section to a voltage of a power supply terminal, and an amplifying transistor which amplifies and reads a signal charge of the detecting section,
the method comprising:
applying a first voltage lower than a power supply voltage to the detecting section in a charge-storage period of the photoelectric conversion element;
applying a negative voltage to a gate of the transfer transistor in a first stage of the charge-storage period; and
applying a ground voltage to the gate of the transfer transistor in a second stage of the charge-storage period.

9. The method according to claim 8, wherein
the applying the first voltage includes:
applying the first voltage to the power supply terminal; and
turning on the reset transistor.

10. The method according to claim 8, further comprising:
applying the power supply voltage to the detecting section at a last stage of the charge-storage period.

11. The method according to claim 8, further comprising:
applying a second voltage, which is an intermediate voltage between the power supply voltage and the first voltage, to the detecting section at a last stage of the charge-storage period.

12. The method according to claim 8, wherein
each of the pixels includes a selection transistor which is connected between the power supply terminal and a drain of the amplifying transistor and used for row selection of the pixel array section.

13. A solid-state imaging device comprising:
a pixel array section which includes a plurality of pixels arranged in a two-dimensional manner; and
a vertical scanning circuit which successively performs selection and scanning for a plurality of rows of the pixel array section,
wherein each of the pixels includes a photoelectric conversion element, a transfer transistor which transfers a signal charge of the photoelectric conversion element to a detecting section, a reset transistor which sets a voltage of the detecting section to a voltage of a power supply terminal, and an amplifying transistor which amplifies and reads a signal charge of the detecting section,
a gate of the transfer transistor is set to have a negative voltage in a charge-storage period of the photoelectric conversion element,
the detecting section is set to a first voltage lower than a power supply voltage in a first stage of the charge-storage period, and
the detecting section is set to a second voltage intermediate between the power supply voltage and the first voltage in a second stage of the charge-storage period.

14. The device according to claim 13, further comprising:
a power supply drive circuit which applies the first voltage and the second voltage to the power supply terminal,
wherein the vertical scanning circuit applies the first voltage to the detecting section in the first stage, and applies the second voltage to the detecting section in the second stage, by turning on the reset transistor.

15. The device according to claim 13, further comprising:
a bias generating circuit which applies the negative voltage and the ground voltage to the gate of the transfer transistor.

* * * * *